US010209338B2

(12) United States Patent
Kiepfer

(10) Patent No.: US 10,209,338 B2
(45) Date of Patent: Feb. 19, 2019

(54) MAGNETIC RESONANCE TOMOGRAPHY APPARATUS AND METHOD

(71) Applicant: Siemens Aktiengesellschaft, Munich (DE)

(72) Inventor: Andreas Kiepfer, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 731 days.

(21) Appl. No.: 14/729,476

(22) Filed: Jun. 3, 2015

(65) Prior Publication Data

US 2015/0346308 A1 Dec. 3, 2015

(30) Foreign Application Priority Data

Jun. 3, 2014 (DE) .................. 10 2014 210 460

(51) Int. Cl.
| | |
|---|---|
| *G01R 33/58* | (2006.01) |
| *G01R 33/54* | (2006.01) |
| *G01R 33/34* | (2006.01) |
| *G01R 33/385* | (2006.01) |
| *G01R 35/00* | (2006.01) |

(52) U.S. Cl.
CPC ............ *G01R 33/58* (2013.01); *G01R 33/34* (2013.01); *G01R 33/385* (2013.01); *G01R 33/543* (2013.01); *G01R 35/005* (2013.01)

(58) Field of Classification Search
CPC ..... H04W 24/08; H04B 17/20; H04N 5/4403; H04N 21/42207
USPC ..................................... 324/96, 76.11, 76.62
See application file for complete search history.

(56) References Cited

U.S. PATENT DOCUMENTS

| | | | |
|---|---|---|---|
| 6,335,979 B1 | 1/2002 | Seto et al. | |
| 7,019,535 B2 * | 3/2006 | Adamian | G01R 35/005 |
| | | | 324/601 |
| 9,991,716 B2 * | 6/2018 | Cutright | G05B 19/048 |
| 9,992,855 B2 * | 6/2018 | Larroux | H05G 1/58 |
| 2002/0198447 A1 | 12/2002 | Van Muiswinkel et al. | |
| 2004/0246004 A1 * | 12/2004 | Heuermann | G01R 35/005 |
| | | | 324/601 |
| 2008/0004819 A1 * | 1/2008 | Namba | G01R 27/28 |
| | | | 702/65 |

(Continued)

FOREIGN PATENT DOCUMENTS

| | | |
|---|---|---|
| JP | H08336504 A | 12/1996 |
| JP | 2004201779 A | 7/2004 |

OTHER PUBLICATIONS

Liste von Abkürzungen gebräuchlicher MR-Sequenzen, German Wikipedia (2011).

(Continued)

*Primary Examiner* — Giovanni Astacio-Oquendo
(74) *Attorney, Agent, or Firm* — Schiff Hardin LLP

(57) ABSTRACT

The present invention relates to a magnetic resonance tomography apparatus for generating tomography data of an examination object in a magnetic field by means of an electromagnetic pulse sequence, having a memory for storing reference tomography data of a reference examination object; an acquisition facility for generating tomography data of the reference examination object by means of the pulse sequence; and an adjustment facility for reducing a deviation between the tomography data and the reference tomography data by adjusting a physical parameter in the pulse sequence.

15 Claims, 1 Drawing Sheet

(56) References Cited

U.S. PATENT DOCUMENTS

2009/0262892 A1    10/2009  Haras
2011/0249881 A1    10/2011  Ootsuka et al.
2012/0235684 A1     9/2012  Stemmer
2017/0319097 A1*   11/2017  Amthor .................. A61B 5/055

OTHER PUBLICATIONS

Siedentopf, "fMRI easy, Messequenzen für die MR-Bildgebung," (2012).

* cited by examiner

MAGNETIC RESONANCE TOMOGRAPHY APPARATUS AND METHOD

BACKGROUND OF THE INVENTION

Field of the Invention

The present invention concerns a magnetic resonance tomography apparatus for generating tomography data of an examination object in a magnetic field by the use of a pulse sequence, and a method for setting a magnetic resonance tomography apparatus.

Description of the Prior Art

In order to plan and parameterize a magnetic resonance examination (MR examination), numerous setting parameters (approx. 700 dependent parameters per measurement cycle) exist in current magnetic resonance tomography devices, which have an effect on an excitation behavior and a final result of the magnetic resonance measurement (data acquisition).

In the event of a software version changeover, a system changeover or a system change, it is almost impossible to determine whether the new settings of the magnetic resonance tomography apparatus reflect the previous excitation behavior of the magnetic resonance tomography apparatus. Attempts are thus made following technical changes of this type to the magnetic resonance tomography device to set the new setting parameters such that they are again consistent with the original setting parameters.

The consistency of the new setting parameters means that they do not mutually exclude or influence one another. This procedure, however, may result in completely different physical excitation behavior and in different measurement results to those prior to the system change. The basic principle behind recovery is to select the influence of the physical input parameters, like for instance of the excitation or the magnetic field, such that the resulting image corresponds to the examination and a medical diagnosis is possible.

A sequence developer, also referred to as parameterizer, therefore manually checks the excitation behavior and the measurement results for each of the changes to the hardware or software of the magnetic resonance tomography apparatus, using sample measurements for instance. This takes place with the aim of manually re-adding and changing the previously automatically adjusted, consistent setting parameters so that the excitation behavior and the measurement result correspond to those prior to the system change.

This method is complicated and prone to errors, since the parameterizer has to have an accurate overview of the setting parameters in order to be able to evaluate the automatically implemented changes and to assess which influence the automatically set setting parameters have on the excitation behavior and the measurement results.

SUMMARY OF THE INVENTION

An object of the invention is to provide a magnetic resonance tomography apparatus and a method for setting a magnetic resonance tomography apparatus, with which an adjustment of the parameters can be implemented more quickly and easily following a technical change in the magnetic resonance tomography apparatus.

According to a first aspect of the invention, the object is achieved by a magnetic resonance tomography apparatus for generating tomography data of an examination object in a magnetic field by the use of a pulse sequence, having a memory for storing reference tomography data of a reference examination object, a measuring facility (scanner) for generating tomography data of the reference examination object by execution of the pulse sequence, and an adjustment computer for reducing a deviation between the tomography data and the reference tomography data by adjusting a physical parameter of the pulse sequence. As a result, the technical advantage is achieved of a quick and simple restart of the magnetic resonance tomography device after a technical change. The pulse sequence is adjusted and changed until the obtained tomography data of the reference examination object correspond to the pre-stored reference tomography data of the reference examination object.

In an embodiment of the magnetic resonance tomography apparatus, the reference tomography data and the tomography data are elements of a spatial frequency area. As a result the technical advantage is achieved that it is possible to dispense with a Fourier transformation and the adjustment can be implemented with less computing outlay.

In a further embodiment of the magnetic resonance tomography apparatus, the reference tomography data and the tomography data are elements of a spatial area. As a result, the technical advantage is achieved of a good concordance in the spatial area, i.e. the tomography images prior to and after a system change.

In another embodiment of the magnetic resonance tomography apparatus, the physical parameter is a pulse spacing between two pulses in the pulse sequence. As a result the technical advantage is achieved, for instance, of the tomography data being adjusted by a measure that is easy to realize.

In a further embodiment of the magnetic resonance tomography apparatus, the physical parameter is a pulse frequency of a pulse in the pulse sequence. As a result, the technical advantage is achieved of the ability to influence an excitation behavior of the examination object.

In another embodiment of the magnetic resonance tomography apparatus, the physical parameter is an output of a pulse in the pulse sequence. As a result, the technical advantage is likewise achieved of the ability to influence an excitation behavior.

In another embodiment of the magnetic resonance tomography apparatus, the physical parameter is a gradient of the magnetic field. As a result, the technical advantage is achieved of selectivity as to the magnetic field being able to be optimized.

In a further embodiment of the magnetic resonance tomography apparatus, the physical parameter is a read-out method of the pulse sequence. As a result, the technical advantage is achieved of the ability to optimize the read-out behavior.

In a further embodiment of the magnetic resonance tomography apparatus, the adjustment computer is configured to determine the deviation between the tomography data and the reference tomography data on the basis of contrast values or color values. As a result, the technical advantage is achieved that an accurate measure of a deviation is obtained between the tomography data and the reference tomography data.

In a further embodiment of the magnetic resonance tomography apparatus, the magnetic resonance tomography apparatus includes a database for storing values, which specify a change in the tomography data as a function of a change in the physical parameter. As a result, the technical advantage is achieved that the adjustment can be implemented with a smaller number of iterations in a shorter time frame.

According to a second aspect of the invention, the object is achieved by a method for setting a magnetic resonance tomography apparatus, having the steps of storing reference tomography data of a reference examination object, generating tomography data of the reference examination object by execution of a pulse sequence, and reducing a deviation between the tomography data and the reference tomography data by adjusting a physical parameter in the pulse sequence. As a result, the same technical advantages are achieved as by the magnetic resonance tomography apparatus according to the first aspect.

In another embodiment of the method, the method includes the step of determining the deviation between the tomography data and the reference tomography data based on contrast values or color values. As a result, the technical advantage is likewise achieved of an accurate measure of a deviation is obtained between the tomography data and the reference tomography data.

In a further embodiment of the method, the method includes the step of determining the deviation between the tomography data and the reference tomography data based on an image analysis in the spatial area. As a result the technical advantage is achieved that the tomography images of the reference examination object are compared before and after a system change.

In a further embodiment of the method, the step of reducing the deviation is implemented on the basis of a value, which specifies a change in the tomography data as a function of a change in the physical parameter. As a result, the technical advantage is likewise achieved of obtaining an accurate measure of a deviation between tomography data and the reference tomography data.

In a further embodiment of the method, the steps of generating tomography data of the reference examination object are repeated by execution of the pulse sequence and the step of reducing the deviation by adjusting the physical parameter of the pulse sequence until the deviation between the tomography data and the reference tomography data achieves a local or global minimum. As a result, the technical advantage is achieved for instance that good adjustment results are obtained.

DESCRIPTION OF THE PREFERRED EMBODIMENTS

Figure 1:
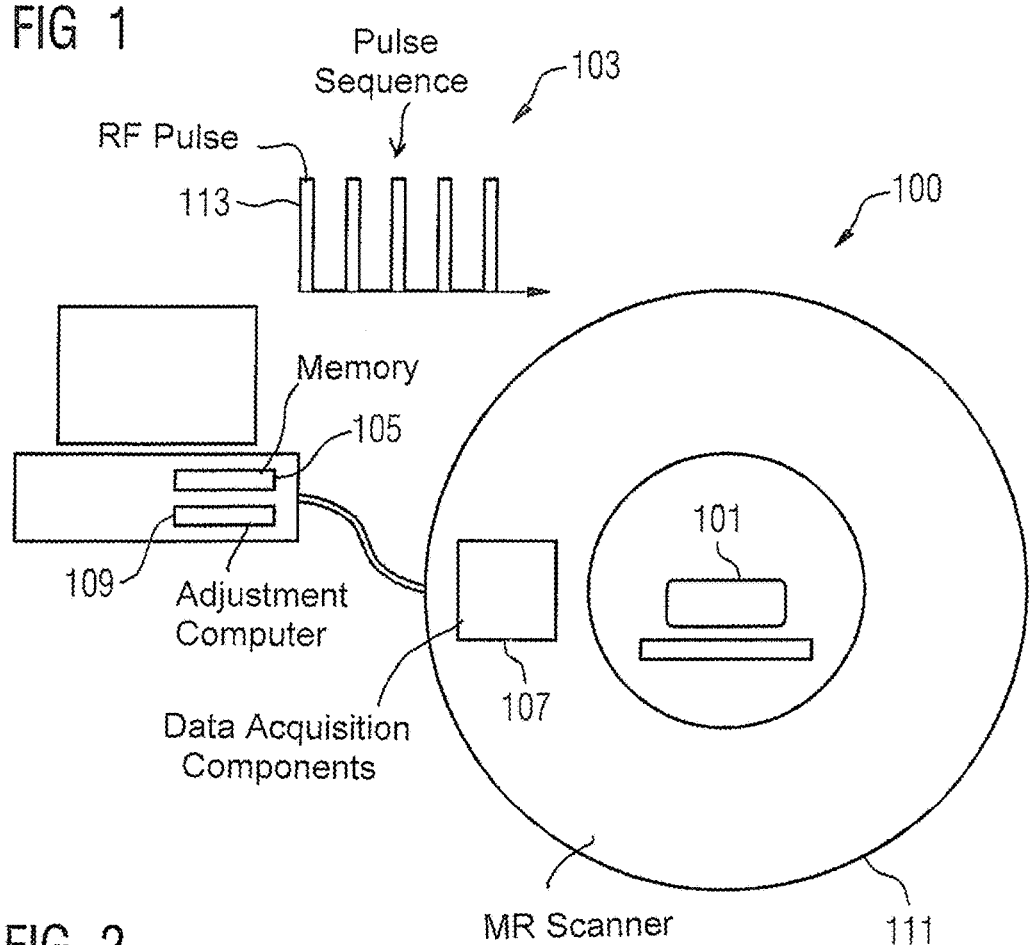
FIG. 1 schematically illustrates a schematic view of a magnetic resonance tomography apparatus.

FIG. 1 shows of a magnetic resonance tomography apparatus 100. The magnetic resonance tomography apparatus 100 includes a scanner that has a basic field magnet 111, in the magnetic field of which is arranged an examination object 101. Pulse sequences 103 are used to operate the scanner of the magnetic resonance tomography apparatus 100, in order to excite the examination object 101 and to acquire the resulting magnetic resonance signals.

A pulse sequence 103 is a combination of radio frequency (RF) pulses 113 and magnetic gradient fields of a specific frequency and strength, which are switched on and off in a predetermined sequence in each second. A pulse sequence 103 is defined by a physical excitation module and a read-out module. The sequence behavior can be described by physical characteristics which render the pulse sequence 103 clearly identifiable and distinguishable from other pulse sequences 103. Each pulse sequence 103 can be influenced by physical parameters that have an effect on the excitation, the read-out and the resulting image. A large number of different pulse sequences 103 are generally known for operating the magnetic resonance (MR) tomography apparatus 100, for instance GRASS, Gradient Refocused Acquisition in the Steady State, FISP—Fast Imaging with Steady state Precession or SE—Spin-Echo.

The known components of a scanner 111 of a magnetic resonance (MR) tomography apparatus 100 used to generate tomography data of the examination object 101 by execution of the pulse sequence 103 are collectively, schematically designated as data acquisition components 107 of the MR scanner 111. For this purpose, signals emitted by the excited nuclear spins are received by reception coils and are digitized, after excitation of the examination object 101. The tomography data correspond to a visual cross-section of the examination object 101 in the spatial domain. The tomography data are entered in a matrix in the spatial frequency domain (k-space). The tomography data from the spatial frequency domain are entered into a memory and are then transformed into tomographic image data in the spatial domain by a Fourier transformation.

The magnetic resonance tomography apparatus 100 includes a digital memory 105, in which reference tomography data of a reference examination object 101 are stored. The reference tomography data are obtained, for example, from the reference examination object 101 prior to a system change. The memory 105 can be formed for instance by a hard disk or a memory chip. The reference examination object 101 is for instance a patient or a phantom, which is used to set the magnetic resonance tomography apparatus 100.

In the event of a system change, such as hardware changes or software updates, it is not the multiple input parameters that are brought into a consistent state, but instead the physical parameters of the pulse sequence 103 are adjusted such that the reference tomography data of the reference examination object 101 prior to the system change correspond to the tomography data of the reference examination object 101 following the system change ("Physical Pulse sequence Fitting").

For this purpose, the magnetic resonance tomography apparatus 100 includes an adjustment computer 109, which changes the physical parameters of the pulse sequence 103 such that a deviation between the tomography data and the reference tomography data is reduced. With a system change, the software executed by the adjustment computer 109, primarily attempts not to alter the parameters of the pulse sequence 103 such that they are consistent again, but instead to set them such that the new parameters of the pulse sequence 103 follow on next from the physical properties and effects of the preceding pulse sequence 103. The adjustment computer 109 can determine a new parameter set for the pulse sequence 103 in the new system environment, this parameter set best reproducing the physical effect of the preceding pulse sequence 103.

The parameter or parameters which are changed by the adjustment computer 109, may be, for example, a temporal pulse spacing between two pulses 113 in the pulse sequence 103, a pulse frequency of one or a number of pulses 113 in the pulse sequence 103, a pulse number in the pulse sequence 103, an output of one or a number of pulses 113 in the pulse sequence 103, a gradient of the magnetic field or a read-out method of the pulse sequence 103. Generally any other parameter in the pulse sequence 103 can also be changed by the adjustment computer 109. The adjustment computer 109 can change one or a number of parameters in the pulse sequence 103, in order to adapt the tomography data to the reference tomography data.

The amount of deviation between the tomography data and the reference tomography data can be determined for instance on the basis of contrast values or color values. It is also possible to determine the deviation based on a correlation value between the tomography data and the reference tomography data. In addition, an image analysis of an image can be performed, said image being generated by the tomography data. The deviation between the tomography data and the reference tomography data can generally be specified by any measure which quantifies the deviation.

In order to facilitate an adjustment by the adjustment computer 109, a database can be provided, in which values are stored that specify a change in the tomography data as a function of a change in the physical parameter. For instance, a value can be stored in the database, which specifies the change in a contrast value with a change in a pulse spacing. Further values relating to a contrast behavior, a pulse, an energy, a pulse sequence or a read-out type can be stored in the database. The database can generally include values for each combination of pulse sequence and parameter. The properties of a pulse sequence and its parameters are packed in the database together with their effect on the physical properties.

The adjustment computer 109 can access the values in the database and thus calculate the required adjustment of the physical parameter of the pulse sequence 103. As a result, concordance of the tomography data with the reference tomography data can be achieved in a few iterations. With one adjustment algorithm, which can adjust the parameters with the aid of the database such that the physical properties of the original pulse sequence are reproduced exactly, no manual sample measurements, attempts or readjustment work needs to be performed by a parameterizer.

Figure 2:
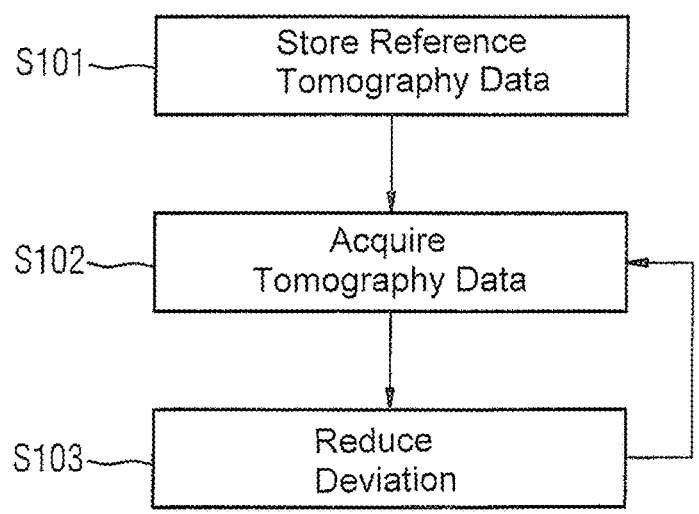
FIG. 2 is a block diagram of the method according to the invention.

FIG. 2 shows a block diagram of a method for setting a magnetic resonance tomography apparatus 100. In a first step S101, the reference tomography data of a reference examination object 101 is stored. After a system change, the tomography data of the reference examination object 101 are generated in step S102 by execution of the pulse sequence 103. Then in step S103 a deviation between the tomography data and the reference tomography data is reduced, by at least one physical parameter of the pulse sequence 103 being adjusted. The step S102 is then repeated in order to obtain new tomography data of the reference examination object 101 by means of the adjusted pulse sequence 103. The repetition can continue to be performed until the deviation between the tomography data and the reference tomography data reaches a local or global minimum.

After a system change, the magnetic resonance tomography apparatus 100 can be quickly put back into operation, thereby achieving an enormous time saving. Nonetheless, a parameterizer can implement smaller adjustment work. A further advantage is that further adjustment work can flow back into the database in order to constantly improve the algorithm. Similarly, the database can result in a quality improvement in the case of software updates, since manual adjustment work is omitted. The database can also be used by a user, i.e. the user's software can also adjust its pulse sequences and parameters accordingly.

All features shown and explained in conjunction with the individual embodiments of the invention can be provided in a different combination in the inventive subject matter in order to realize its advantageous effects.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance tomography apparatus comprising:
   an electronic memory in which reference tomography data of a reference object are stored;
   a magnetic resonance scanner;
   a control computer configured to operate the magnetic resonance scanner, while an examination object is situated in the magnetic resonance scanner, to acquire magnetic resonance tomography data from the examination object by executing a data acquisition pulse sequence with the magnetic resonance scanner; and
   an adjustment computer having access to said memory, and provided with said magnetic resonance tomography data acquired from the examination object, said adjustment computer being configured to reduce a deviation between said magnetic resonance tomography data acquired from the examination object and the reference tomography data by adjusting a physical parameter of said pulse sequence, and thereby making an adjusted pulse sequence available to said control computer in an electronic form for operating said magnetic resonance scanner.

2. The magnetic resonance tomography apparatus as claimed in claim 1 comprising storing said reference tomography data, and acquiring said magnetic resonance tomography data from the examination object, as entries in the spatial frequency domain.

3. The magnetic resonance tomography apparatus as claimed in claim 1 comprising storing said reference tomography data, and acquiring said magnetic resonance tomography data from the examination object, as elements in the spatial domain.

4. The magnetic resonance tomography apparatus as claimed in claim 1 wherein said adjustment computer is configured to adjust a pulse spacing in said pulse sequence, as said physical parameter, in order to reduce said deviation.

5. The magnetic resonance tomography apparatus as claimed in claim 1 wherein said adjustment computer is configured to adjust a pulse frequency of a pulse in said pulse sequence, as said physical parameter, in order to reduce said deviation.

6. The magnetic resonance tomography apparatus as claimed in claim 1 wherein said adjustment computer is configured to adjust a time of emission of a pulse in said pulse sequence, as said physical parameter, in order to reduce said deviation.

7. The magnetic resonance tomography apparatus as claimed in claim 1 wherein said adjustment computer is configured to adjust a gradient of a magnetic field that is produced in said magnetic resonance scanner by said pulse sequence, as said physical parameter, in order to reduce said deviation.

8. The magnetic resonance tomography apparatus as claimed in claim 1 wherein said adjustment computer is configured to adjust a readout module of said pulse sequence, as said physical parameter, in order to reduce said deviation.

9. The magnetic resonance tomography apparatus as claimed in claim 1 wherein said adjustment computer is configured to reconstruct a respective image from each of said magnetic resonance tomography data and said reference tomography data, each of said images having an image attribute selected from the group consisting of contrast and color, and wherein said adjustment computer is configured to adjust said image attribute, as said physical parameter, in order to reduce said deviation.

10. The magnetic resonance tomography apparatus as claimed in claim 1 comprising a database in which values are stored that specify relationship between a change in said magnetic resonance tomography data and a change in said physical parameter, and wherein said adjustment computer is configured to access said database to use said relationship in order to reduce said deviation.

11. A method for producing a pulse sequence for operating a magnetic resonance tomography apparatus, said method comprising:

storing reference tomography data of a reference object are stored in an electronic memory;

from a control computer, operating a magnetic resonance scanner, while an examination object is situated in the magnetic resonance scanner, to acquire magnetic resonance tomography data from the examination object by executing a data acquisition pulse sequence with the magnetic resonance scanner; and providing an adjustment computer with said magnetic resonance tomography data acquired from the examination object and, from said adjustment computer, accessing said memory to obtain said reference tomography data, and in said adjustment computer, reducing a deviation between said tomography data acquired from the examination object and the reference tomography data by adjusting a physical parameter of said data acquisition pulse sequence, and thereby making an adjusted data acquisition pulse sequence available to said control computer in an electronic form for operating said magnetic resonance scanner.

12. The method as claimed in claim 11 comprising, in said adjustment computer, reconstructing a respective image from each of said magnetic resonance tomography data and said reference tomography data, each of said images having an image attribute selected from the group consisting of contrast and color, and adjusting said image attribute, as said physical value, in order to reduce said deviation.

13. The method as claimed in claim 11 comprising storing said reference tomography data, and acquiring said magnetic resonance tomography data from the examination object, as elements in the spatial domain.

14. The method as claimed in claim 11 comprising storing values in a database that specify relationship between a change in said magnetic resonance tomography data and a change in said physical parameter, and from said adjustment computer, accessing said database and using said relationship in order to reduce said deviation.

15. The method as claimed in claim 11 comprising repeatedly acquiring said magnetic resonance tomography data from the examination object using said adjusted data acquisition pulse sequence, and repeatedly reducing said deviation, until said deviation achieves a predetermined local or global minimum.

* * * * *